US008843331B2

(12) United States Patent
Irissou et al.

(10) Patent No.: US 8,843,331 B2
(45) Date of Patent: Sep. 23, 2014

(54) LIGHT EMITTING DIODE FAULT MONITORING

(75) Inventors: Pierre R. Irissou, Sunnyvale, CA (US); Stephane Legoff, Pibrac (FR); Sam Seiichiro Ochi, Saratoga, CA (US); Etienne Colmet-Daage, Los Altos, CA (US)

(73) Assignee: Microsemi Corporation, Aliso Viejo, CA (US)

( * ) Notice: Subject to any disclaimer, the term of this patent is extended or adjusted under 35 U.S.C. 154(b) by 913 days.

(21) Appl. No.: 12/545,437

(22) Filed: Aug. 21, 2009

(65) Prior Publication Data

US 2010/0049454 A1 Feb. 25, 2010

Related U.S. Application Data

(60) Provisional application No. 61/090,748, filed on Aug. 21, 2008, provisional application No. 61/090,841, filed on Aug. 21, 2008.

(51) Int. Cl.
*G01R 31/00* (2006.01)
*H05B 33/08* (2006.01)

(52) U.S. Cl.
CPC .................................. *H05B 33/0893* (2013.01)
USPC ............................................................ 702/58

(58) Field of Classification Search
USPC ............................................................ 702/58
See application file for complete search history.

(56) References Cited

U.S. PATENT DOCUMENTS 5,986,647 A 11/1999 Feldman
6,153,980 A 11/2000 Marshall et al.
6,521,879 B1 2/2003 Rand et al.
6,816,816 B2 11/2004 Slates et al.
7,800,876 B2 9/2010 Peker et al.
2002/0043943 A1 4/2002 Menzer et al.
2005/0231459 A1 10/2005 Furukawa
2005/0259439 A1 11/2005 Cull et al.
2006/0007097 A1 1/2006 Ichikawa (Continued)

FOREIGN PATENT DOCUMENTS

EP 1965609 A2 9/2008
JP 2002-025784 A 1/2002
JP 2004-309614 * 4/2004 ............... G09G 3/32
WO 97/29320 A1 8/1997

OTHER PUBLICATIONS

ISA/KR, International Application No. PCT/US2009/054647, International Preliminary Report on Patentability and Written Opinion dated Mar. 3, 2011, 7 pp.

(Continued)

*Primary Examiner* — Tung S Lau
(74) *Attorney, Agent, or Firm* — Simon Kahn

(57) ABSTRACT

Methods, systems, and devices are described for providing fault monitoring for light emitting diode (LED) circuits. Embodiments receive an indication from a fault control module that a fault has occurred in a portion of an LED module (e.g., a series string of LEDs). The fault may represent an open fault or a closed fault condition. In some embodiments, a monitoring module receives the fault indication and generates a further representation that the fault has occurred (e.g., for use by external components or systems). In other embodiments, the monitoring module in configured to further indicate which in the LED module has failed, and/or in what fault condition (e.g., open or closed).

15 Claims, 10 Drawing Sheets

(56) References Cited

U.S. PATENT DOCUMENTS

| | | | |
|---|---|---|---|
| 2006/0007103 | A1 | 1/2006 | Oh et al. |
| 2006/0007110 | A1 | 1/2006 | Hung et al. |
| 2006/0007112 | A1 | 1/2006 | Park |
| 2007/0013322 | A1 | 1/2007 | Tripathi et al. |
| 2008/0001061 | A1 | 1/2008 | Glassner et al. |

OTHER PUBLICATIONS

PCT/US2009/054647, filed Aug. 21, 2009, International Search Report dated Mar. 31, 2010, 3 pages.

* cited by examiner

LIGHT EMITTING DIODE FAULT MONITORING

CROSS-REFERENCES

This application claims the benefit of and is a non-provisional of U.S. Provisional Application Ser. No. 61/090,748, filed on Aug. 21, 2008, titled "LIGHT EMITTING DIODE FAULT CONTROL"; and U.S. Provisional Application Ser. No. 61/090,841, filed on Aug. 21, 2008, titled "LIGHT EMITTING DIODE FAULT MONITORING," both of which are hereby expressly incorporated by reference in their entirety for all purposes.

BACKGROUND

The present invention relates to fault monitoring circuits in general and, in particular, to fault monitoring circuits for light emitting diodes.

Light emitting diodes ("LEDs") represent a fast growing market, at least because of their relatively high efficiency, low cost, and simplicity of handling and integration for many purposes. For example, LEDs may be found in numerous lighting applications, including automotive tail lamps and turn signals, large multicolor displays, flashlights, indicators, etc. In many of these applications, it may be undesirable to use a single LED (e.g., a single LED may not produce enough light). As such, multiple LEDs may be used in series.

Because of aging of the LEDs, undesirable power conditions, lead failures, and/or other reasons, some or all of the LEDs in a series application may fail. This failure may create either an open circuit at the LED or a short circuit at the LED. If the LED failure creates a short circuit, the other LEDs in series may still operate. If the LED failure creates an open circuit, the entire series string of LEDs may cease to operate (i.e., the open circuit may prevent current from flowing through the entire LED string). In either case, it may be desirable to detect and report the LED failure.

As such, it may be desirable to provide methods, systems, and devices for monitoring and reporting the failure of one or more LEDs in a series string of LEDs.

SUMMARY

Among other things, methods, systems, and devices are described for providing fault monitoring for light emitting diode (LED) circuits. Embodiments receive an indication from a fault control module that a fault has occurred in a portion of an LED module (e.g., a series string of LEDs). The fault may represent an open fault or a closed fault condition. In some embodiments, a monitoring module receives the fault indication and generates a further representation that the fault has occurred (e.g., for use by external components or systems). In other embodiments, the monitoring module in configured to further indicate which in the LED module has failed, and/or in what fault condition (e.g., open or closed).

In one set of embodiments, a fault monitoring circuit is provided for monitoring fault conditions in LEDs. The circuit includes: a fault detection module in electrical communication with an LED module including a number of LEDs, each of the number of LEDs being electrically coupled with another of the number of LEDs to form a series string of the number of LEDs, the fault detection module including a number of detection units, each detection unit in communication with a respective one of the number of LEDs and adapted to: detect a fault condition in the respective one of the number of LEDs; and output a fault indication substantially upon detection of the fault condition; and a fault monitoring module, in electrical communication with at least one of the detection units and adapted to receive the fault indication from the at least one of the detection units when a fault condition is detected by the at least one of the detection units in the respective one of the number of LEDs.

In another set of embodiments, a method is provided for monitoring fault conditions in LEDs. The method includes: detecting a fault condition in a respective one of a number of LEDs comprised by an LED module, each of the number of LEDs in the LED module being electrically coupled with another of the number of LEDs to form a series string of the number of LEDs; for each of the number of LEDs, outputting a fault indication substantially upon detection of the fault condition in the respective one of a number of LEDs; and outputting a fault monitoring signal as a function of the fault indications, the fault monitoring signal indicating at least when one of the number of LEDs is experiencing the fault condition.

And in another set of embodiments, a computational system is provided. The system includes: a processor, communicatively coupled with a fault detection module, the fault detection module: in electrical communication with an LED module including a number of LEDs, each of the number of LEDs being electrically coupled with another of the number of LEDs to form a series string of the number of LEDs; and including a number of detection units, each detection unit in communication with a respective one of the number of LEDs and adapted to detect a fault condition in the respective one of the number of LEDs, and output a fault indication substantially upon detection of the fault condition, wherein the processor is configured to execute instructions for monitoring fault conditions in light emitting diodes ("LEDs"), such that, when the instructions are executed, the processor: receives a fault indication from at least one of the detection units; and outputs a fault monitoring signal as a function of the fault indication, the fault monitoring signal indicating at least when the respective one of the number of LEDs is experiencing the fault condition.

BRIEF DESCRIPTION OF THE DRAWINGS

A further understanding of the nature and advantages of the present invention may be realized by reference to the following drawings. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Among other things, methods, systems, and devices are described herein for providing fault detection, control, and/or monitoring for light emitting diode (LED) circuits. For various reasons, including aging of the LEDs, undesirable power conditions, lead failures, and/or other reasons, some or all of the LEDs in an LED module (e.g., a series string of LEDs) may fail. This failure may create either an open circuit at the LED or a short circuit at the LED. If the LED failure creates a short circuit, the other LEDs in series may still operate. If the LED failure creates an open circuit, the entire series string of LEDs may cease to operate (i.e., the open circuit may prevent current from flowing through the entire LED string). In either case, it may be desirable to detect and report the LED failure.

Fault Control Embodiments

Among other things, methods, systems, and devices are provided for maintaining current flow through a series string of LEDs, even where the failure of one or more LEDs in the string would otherwise create an open circuit condition.

Figure 1A:
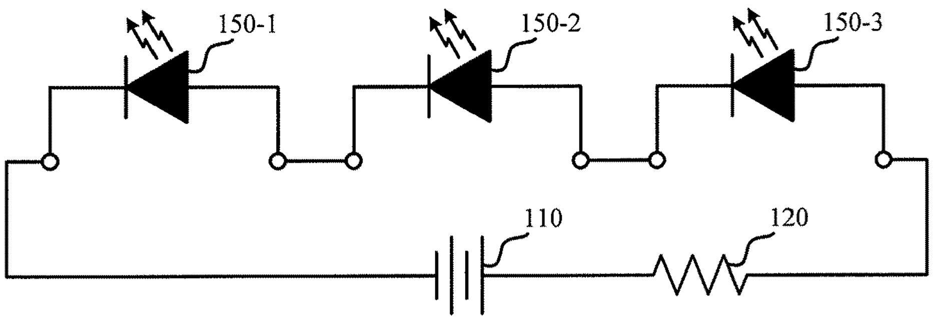
FIG. 1A PRIOR ART
FIG. 1A shows an illustrative embodiment of a typical LED application where the LEDs are connected in series to create an LED string.

FIG. 1A shows an illustrative embodiment of a typical LED application where the LEDs are connected in series to create an LED string. As shown, the application includes three LEDs 150 powered by a source 110. A resistor 120 or other component may be included to limit current flow through the LEDs 150. Any or all of the LEDs 150 may fail for one or more reasons. In one example, aging in the semiconductors used for manufacturing the LEDs 150 may cause failures over time. In another example, undesirable power conditions, like current surges, may permanently damage an LED 150. In yet another example, lead failures may cause the connection between an LED 150 and the power source 110 to be broken.

It will be appreciated that any of these or other example cases may cause either an open or closed circuit condition to occur when the LED 150 fails. A closed circuit condition may allow current to continue to follow through the string of LEDs 150 in series. However, an open circuit condition in even a single LED (e.g., 150-1) may prevent current from reaching the other LEDs (e.g., 150-2 and 150-3) in the string. As such, the entire string of LEDs 150 may cease to operate from an open circuit failure of any one or more LEDs 150 in the string.

Figure 1B:
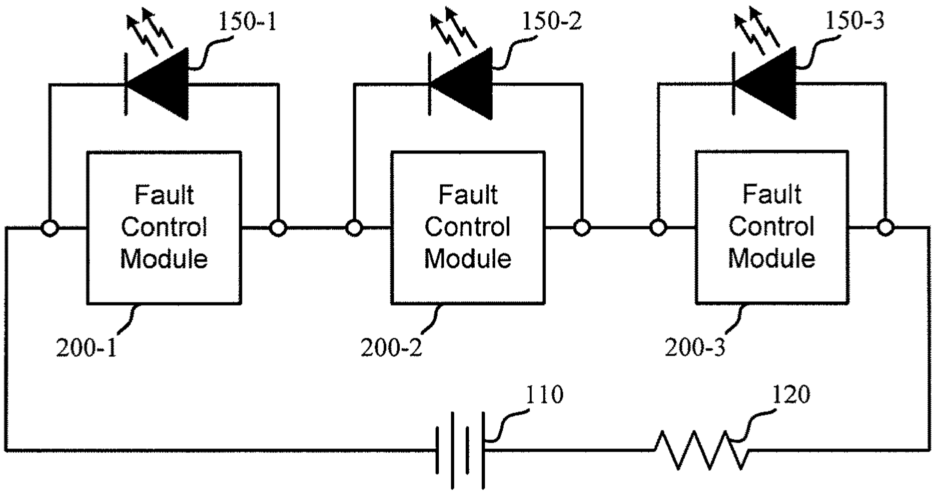
FIG. 1B shows an illustrative embodiment of a series LED application that includes fault control circuitry, according to various embodiments.

Some embodiments of the invention may address issues associated open circuit LED failures, by establishing an alternate current path around an LED when the LED fails in an open circuit configuration. FIG. 1B shows an illustrative embodiment of a series LED application that includes fault control circuitry, according to various embodiments. As in FIG. 1A, the application includes three LEDs 150 powered by a source 110. A resistor 120 or other component may be included to limit current flow through the LEDs 150.

Unlike in FIG. 1A, the LED application illustrated by FIG. 1B includes a fault control module 200 for each LED 150. For example, a first fault control module 200-1 is connected in parallel with a corresponding first LED 150-1. The fault control module 200 operates to control a fault condition of one or more LEDs 150. In some embodiments, the fault control module 200 maintains current flow through the series string of LEDs 150, even where the failure of one or more LEDs 150 in the string would otherwise create an open circuit condition. In certain embodiments, the fault control module 200 controls a fault condition of one or more LEDs 150 only when its corresponding LED 150 fails in an open circuit condition (e.g., when the LED 150 fails in a closed circuit condition, the LED 150 itself may provide a short circuit condition, thereby maintaining current flow through the LED 150 string).

Figure 2:
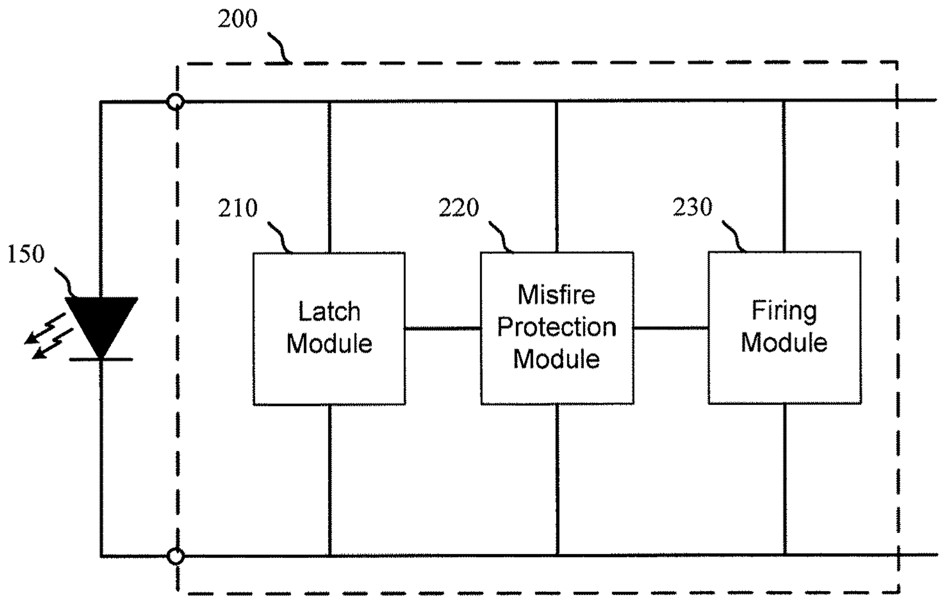
FIG. 2 shows a simplified block diagram of a fault control module, according to various embodiments.

FIG. 2 shows a simplified block diagram of a fault control module 200, according to various embodiments. In some embodiments, the fault control module 200 functions as the fault control module 200 of FIG. 1B. The fault control module 200 includes a latch module 210 and a firing module 230. In some embodiments, some or all of the open fault control module 200 is integrated into an integrated circuit ("IC"). In other embodiments, some or all of the open fault control module 200 is integrated with the LED 150.

Embodiments of the firing module 230 are adapted to trigger the latch module 210 when there is a fault condition in an LED 150 in communication with the fault control module 200. In some embodiments, the firing module 230 is adapted only to trigger when the LED 150 faults in an open circuit condition. Certain embodiments of the firing module 230 may be configured to trigger when a certain input voltage crosses a trigger threshold. The trigger threshold may be preset or adjustable. For example, in one embodiment, a zener diode is used to set the trigger threshold; and in another embodiment, a bandgap voltage reference circuit is used to set the trigger threshold. It will be appreciated that any module capable of triggering the latch module 210 may be used according to embodiments of the invention.

In some embodiments, the latch module 210 is adapted to receive a trigger signal from the firing module 230 and latch in a particular mode. In certain embodiments, the latch module 210 turns ON when triggered, and remains ON until some other condition occurs (i.e., even after the trigger signal is no longer present). When in the ON mode, the latch module 210 may provide a current path separate from the LED 150. For example, when the LED 150 fails in an open condition, the firing module 230 may communicate a trigger signal to the latch module 210. The latch module 210 may then turn ON, creating an alternate current path separate from the failed open LED 150.

In this way, triggering the latch module 210 may effectively force a short circuit condition to occur whenever there is an LED 150 failure. It is worth noting that some embodiments of the latch module 210 may provide a voltage drop when turned ON. In fact, in some embodiments, the voltage drop across the latch module 210 in the ON mode may be greater than, less than, or equal to the nominal voltage drop of the LED 150. For example, in the ON state, the latch module 210 may provide the alternate current path through a transistor, across which there may be a voltage drop. As such, the latch module 210 may not provide a true short circuit condition, but rather an alternate closed circuit path through which current may flow. It will be appreciated that, when the alternate current path flows through a transistor, it may be desirable to maintain a voltage drop that is as low as reasonably possible (e.g., by scaling the transistor appropriately in function of the amount the current). This may allow the power dissipation to remain as low as possible in the device bypassing the LED 150.

In some embodiments, a silicon controlled rectifier ("SCR") is used as part of the latch module 210. The latch module 210 may include bipolar junction transistors, MOSFETs, or any other useful device. It will be appreciated, however, that many types of latch modules 210 are possible according to embodiments of the invention. In fact any module that may be triggered and may provide a closed circuit condition may be used. For example, certain types of nanodevices, paints, and/or other devices may be used to create a short or closed circuit around the LED 150 when activated or triggered.

It will be appreciated that the fault control module 200 may include other components or modules for various reasons. For example, certain modules may be provided to protect circuit elements or maintain certain functionality under certain conditions. In some embodiments, the fault control module 200 includes a misfire protection module 220. The misfire protection module 220 may be adapted to ensure that the latch module 210 only turns ON when desired. For example, non-ideal circuit properties (e.g., parasitic capacitance of circuit components) may create circuit sensitivities to certain operational environments (e.g., fast dV/dt transitions when the LED string is turned on or when the LED 150 first fails open). These non-idealities may cause the latch module 210 to turn ON without receiving a trigger signal from the firing module 230. The misfire protection module 220, then, may be adapted to ensure that the latch module 210 stays OFF during these non-ideal environmental conditions, and only turns ON when properly triggered by the firing module 230.

Figure 3:
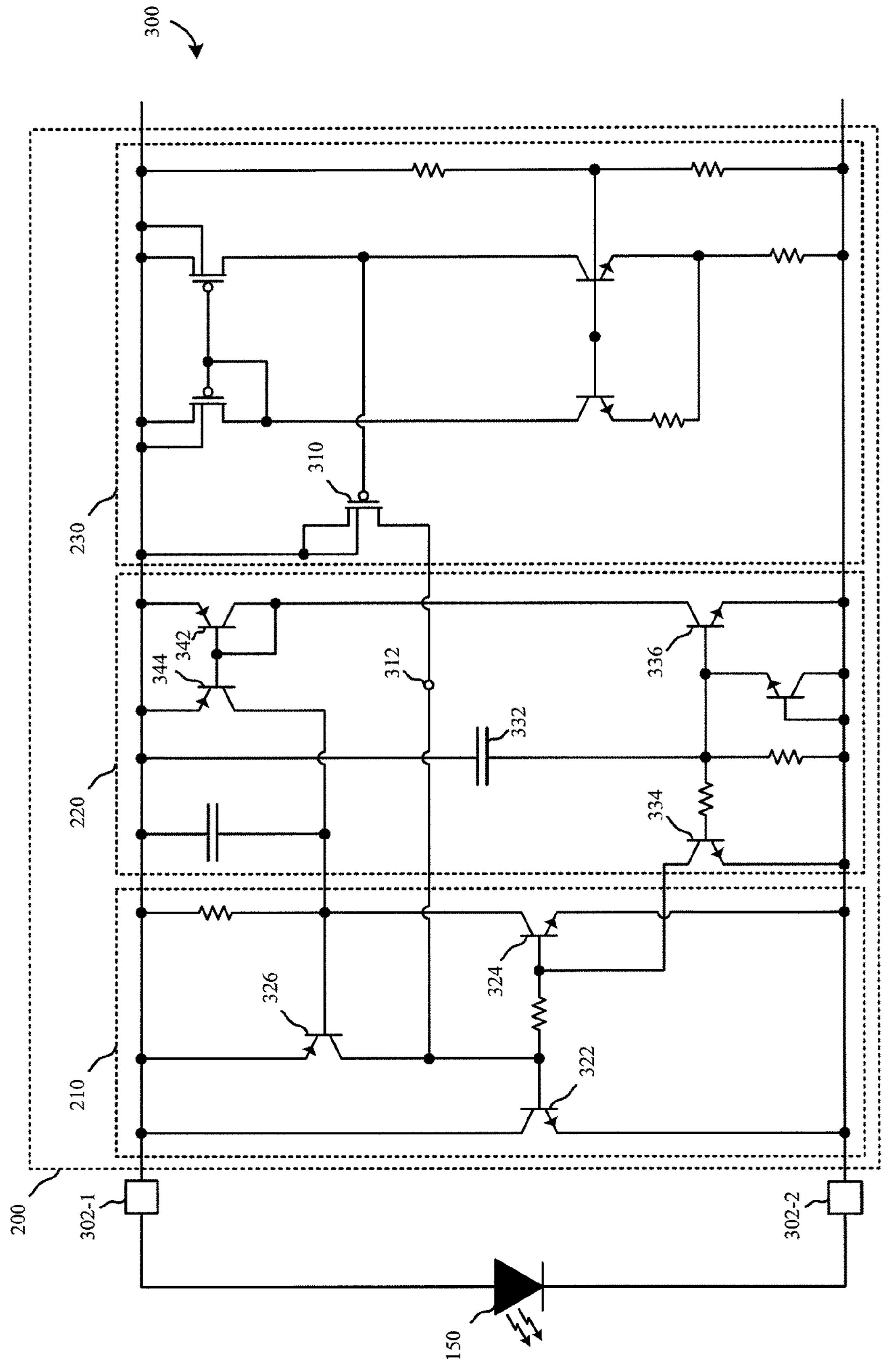
FIG. 3 shows a schematic diagram of a circuit having an embodiment of a fault control module, according to various embodiments.

It will be further appreciated that many implementations of the fault control module 200, the latch module 210, the firing module 230, and the misfire protection module 220 are possible according to embodiments of the invention. FIG. 3 shows a schematic diagram of a circuit 300 having an embodiment of a fault control module, according to various embodiments. As in FIG. 2, the fault control module 200 is shown to include a latch module 210, a firing module 230, and a misfire protection module 220.

Embodiments of the firing module 230 include a number of resistors and transistors, configured to establish a current reference (e.g., a bandgap reference) for a firing transistor 310. During normal operation of the LED 150, a first voltage level (e.g., an operational voltage typically between 1.4 and 4 volts, depending on the color of the LED 150) is dropped between the LED (N+1) rail 302-1 and the LED (N) rail 302-2. If the LED 150 fails in a closed circuit configuration, the voltage between rail 302-1 and rail 302-2 becomes a second voltage level which is close to zero, and which keeps firing transistor 310 OFF (i.e, non conducting state). However, because of this short, current flow will continue from rail 302-1 and flow unimpeded to rail 302-2 so that the rest of the LEDs 150 in series can continue to function.

In an event where the LED 150 fails open, the voltage between rail 302-1 and rail 302-2 may typically jump to a third voltage level, which may exceed the first voltage level. The circuit 300 may be configured so that the third voltage level is high enough to cause the firing module 230 to turn firing transistor 310 ON (i.e., to a conducting state). This may cause a trigger signal at node 312 to be pulled HIGH. In the embodiment shown, the voltage threshold at which firing transistor 310 is turned ON is set by the bandgap reference topology, and may be adjusted according to whatever threshold is desired.

The latch module 210 includes a number of transistors and resistors, configured in a latching topology. The base of a transistor 324 and a mirror transistor 322 are connected with node 312. Another transistor 326 is connected between rail 302-1 and node 312. When node 312 is pulled HIGH (e.g., when the triggering signal is sent by the firing module 230), a base voltage may be provided to turn ON transistor 324. Turning ON transistor 324 may allow current to flow through transistor 324, thereby pulling down the base of transistor 326.

As the base of transistor 326 is pulled down relative to rail 302-1, transistor 326 may turn ON. With transistor 326 turned ON, the base of transistor 324 may be pulled up towards rail 302-1, latching transistor 324 and transistor 326 in their respective ON states. In this way, transistor 324 and transistor 326 may function as a latching device (e.g., like an SCR). It is worth noting that, because transistor 324 and transistor 326 become latched in their respective ON states, they may remain ON even if the trigger signal at node 312 becomes LOW.

It will be appreciated that some applications may require relatively large amounts of current. As such, additional circuitry may be desirable for handling current flow through an alternate path circumventing the LED 150. In the circuit 300 embodiment shown in FIG. 3, this function may be provided by transistor 322. Once transistor 324 and transistor 326 become latched in their respective ON states, the base of transistor 322 may be pulled toward rail 302-1. This may cause transistor 322 to turn ON, which may allow collector-emitter current to flow through transistor 322. Transistor 322 may be sized to handle the current that was supplied to the LED 150 while it was operational (e.g., 350 mA).

It is worth noting that, when transistor 322 turns ON, the voltage between rail 302-1 and rail 302-2 may be pulled down to a fourth voltage level. The circuit 300 may be configured so that the fourth voltage level is low enough to cause the firing module 230 to turn transistor 310 OFF, thereby causing the trigger signal at node 312 to return to a LOW level. As discussed above, even after node 312 becomes LOW, transistor 322 may remain ON, due to the latching functionality of transistor 324 and transistor 326. In this way, transistor 322, transistor 324, transistor 326, and other associated components may be used to create the latching module 210.

It is further worth noting that non-idealities of components of the circuit 300 may cause undesirable operation under certain operating conditions. For example, when the circuit 300 is started up, when the LED 150 fails open, and/or in other circumstances, rail 302-1 (or another point in the circuit 300) may exhibit a fast voltage transition (i.e., a high dV/dt). Parasitic capacitance in various components of the circuit 300 may pass the high dV/dt transitions, causing undesirable results.

In one embodiment, the LED 150 is operational (i.e., the LED 150 has not failed). The circuit 300 is turned on, generating a high dV/dt transition in rail 302-1. Parasitic capacitances in the circuit 300 cause transistor 326 to turn ON as a result of the high dV/dt transition. This may, in turn, cause transistor 324 to turn on, thereby latching the latching module 210 in the ON state. Current may then flow through transistor 322, which may under-drive the LED 150.

At least to counteract undesirable effects from dV/dt transitions, embodiments of the circuit 300 include the misfire protection module 220. In one embodiment, when fast dV/dt transitions occur, a capacitor 332 is used to effectively AC couple the bases of transistor 334 and transistor 336, with respect to rail 302-1, thereby turning them on. Transistor 334 is configured so that, when ON, it effectively shorts the bases of transistor 322 and transistor 324 to rail 302-2. This may keep transistor 322 and transistor 324 during this dV/dt transition.

Transistor 336 drives the diode connected another transistor 342 connected as a PNP mirror circuit with respect to yet another transistor 344. Transistor 344 pulls the base of transistor 326 in the latch module 210 to rail 302-1, which may also preventing transistor 326 from turning on during this dV/dt event. In at least this way, the misfire protection module 220 may effectively prevent improper dV/dt induced turn-on or misfire of the latch module 210. As shown, the misfire protection module 220 may include other components, for example, to actively latch the misfire protection for some time. It is worth noting that the misfire protection module 220 may effectively turn OFF when or after effects from dV/dt transitions have subsided.

Of course, many implementations of fault control modules 200 are possible, according to embodiments of the invention. Further, embodiments of the invention may be implemented in different forms with different types of integration. In one embodiment, an IC is provided having three fault control modules 200. The IC may be configured to interface each fault control module 200 with an LED 150 (e.g., via one or more pins). The IC may further be adapted to be driven by one or more current sources, current sinks, power supplies, and/or other integrated, internal, or external components.

Figure 4:
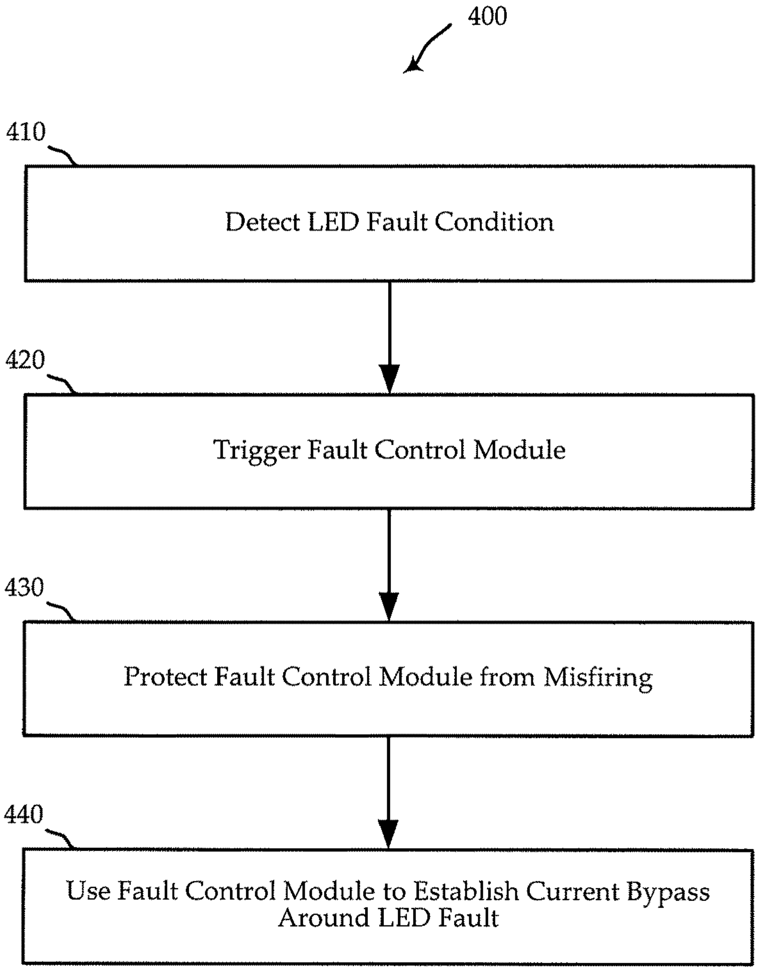
FIG. 4 shows a flow diagram of illustrative methods for fault control in a series LED application, according to various embodiments

FIG. 4 shows a flow diagram of illustrative methods for fault control in a series LED application, according to various embodiments. The method 400 begins at block 410 by detecting an LED failure condition. When the LED failure condition is detected in block 410, a fault control module may be triggered at block 420. In some embodiments, the fault control module is triggered at block 420 only when the LED failure condition is an open circuit failure condition. In some embodiments, the method 400 protects the fault control module at block 430 from being improperly triggered (e.g., by fast dV/dt transitions).

At block 440, the fault control module triggered in block 420 may be used to establish an alternate current path to circumvent the failed LED (i.e., the now-open circuit at the failed LED). The alternate current path established in block 440 may allow current to continue to flow through the remainder of the series LED application, even with an open circuit across one or more of the LEDs in the string.

Fault Monitoring Embodiments

The above embodiments, described with reference to FIGS. 1-4, illustrate some techniques for detecting and controlling LED faults. It may be desirable to monitor for LED faults, and, once the fault is detected and/or controlled, to report the fault to a fault reporting system. This may, for example, alert a technician that a fault has occurred, and in some embodiments, where the fault has occurred. Among other things, methods, systems, and devices are described for monitoring and reporting the failure of one or more LEDs in an LED module.

Figure 5:
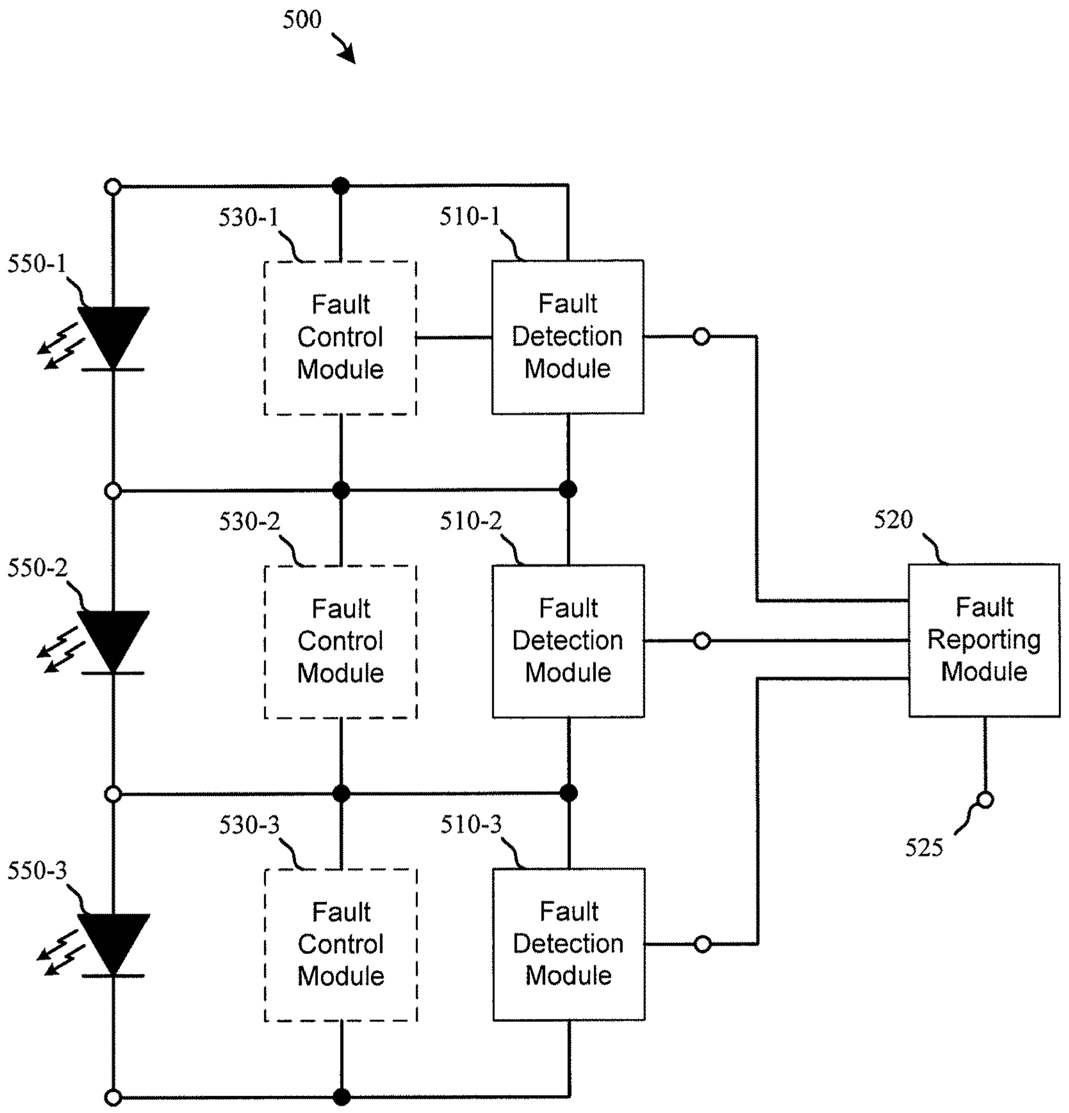
FIG. 5 shows a simplified block diagram of an embodiment of a fault monitoring arrangement, according to various embodiments

FIG. 5 shows a simplified block diagram of an embodiment of a fault monitoring arrangement, according to various embodiments. The arrangement 500 includes three fault detection modules 510, each adapted to detect faults in a respective LED 550 and to communicate fault detection information to a fault reporting module 520. It will be appreciated that many types of arrangements 500 are possible, according to embodiments of the invention. For example, any number of LEDs 550 may be monitored for faults. Further, all or parts of the arrangements 500 may be integrated in various ways (e.g., as one or more circuit blocks on an integrated circuit ("IC")), or implemented in different forms (e.g., as discrete or integrated components, software, etc.).

In many typical applications, LEDs 550 are strung together in series, such that current may flow through the entire string of LEDs 550. This may create some potential difficulties in monitoring for LED 550 failures. For example, LEDs 550 may fail in either open circuit conditions (i.e., the LED 550 failure creates an open circuit in the string) or in a closed circuit condition (i.e., the LED 550 failure creates a substantially short circuit in the string). If an LED 550 in the string fails in an open circuit condition, current may cease to flow through the entire string, making it difficult to visually or otherwise determine which individual LED 550 in the string failed. Alternately, if an LED 550 in the string fails in a closed circuit condition, current may continue to flow through the closed circuit into the remainder of the string, making it difficult to globally detect a failure in the string (e.g., the overall current in the string may not substantially change, especially if driven by a constant current source).

In one set of embodiments, the arrangement 500 is adapted to detect a failure in only a portion of the string of LEDs 550, even where an open circuit failure occurs. In certain of these embodiments, each fault detection module 510 is adapted to detect failures in an individual respective LED 550. For example, a first fault detection module 510-1 may detect a failure in its respective LED 550-1. Because each LED 550 may be individually monitored by a respective fault detection module 510, the fault reporting module 520 may be adapted to report failures of individual or multiple LEDs 550 in the string. In various embodiments, this reporting may include reporting which LED 550 in the string failed, which type of failure condition (e.g., open circuit or closed circuit) occurred, and/or other useful and individualized fault information.

In another set of embodiments, the fault detection modules 510 are adapted to detect short circuit failures in the LEDs 550. In certain of these embodiments, each fault detection module 510 is adapted to detect changes in its respective LED 550 that indicate failures in both short circuit and open circuit configurations. Failure information may then be sent to a fault reporting module 520. By receiving information regarding even short circuit failures, various embodiments of the fault reporting module 520 may report either type of failure condition, globally and/or individually.

In some embodiments, a fault control module 530 is provided in communication with each LED 550 to establish an alternate current path when its respective LED 550 fails in an open circuit condition. For example, where a first LED 550-1 fails in an open circuit condition, it may be desirable to ensure that current continues to flow in the second LED 550-2 and the third LED 550-3. By establishing a current path through the fault control module 530, current may bypass the open circuit at the first LED 550-1 and continue to flow to the other LEDs (i.e., 550-2 and 550-3).

It will be appreciated that many types of fault detection modules 510 are possible, according to the invention. In fact, any module capable of converting an LED 550 fault condition into useful information for fault reporting may be used as a fault detection module 510. In some embodiments, the fault control module is implemented as the circuit shown in FIG. 3. In other embodiments, the fault detection module 510 includes a light detector. The light detector may include any device capable of detecting light. For example, photodiodes, LEDs, photoresistive elements (e.g., devices, materials, paints, etc.), and/or other devices may be used. In certain embodiments, the light detector is adapted to react to broad spectra of light; while in other embodiments, the light detector is tuned to react to specific frequencies of visible and/or non-visible light.

In one embodiment, each fault detection module 510 is integrated at least with its respective LED 550. For example, a photodiode is placed next to each LED 550. When the LED 550 is ON and operational, current may be produced by the photodiode. If the LED 550 fails, regardless of whether it fails open or closed, the LED 550 will cease to emit light even when turned ON. As a result, the current in the photodiode may change. By detecting the change in photodiode current, it may be possible to detect a fault in the LED 550.

In certain embodiments, this and other techniques may be used to implement an LED 550 with an integrated fault detection module 510. Of course, other components may also be integrated. For example, some embodiments of the fault control module 530 include a silicon-controlled rectifier ("SCR") as a latching device. Because the SCR may typically be implemented on silicon, the SCR may provide an integration platform for fault detection module 510. Embodiments may provide further integration, for example, by providing the integrated platform with the LED 550 in one integrated package.

Figure 6A:
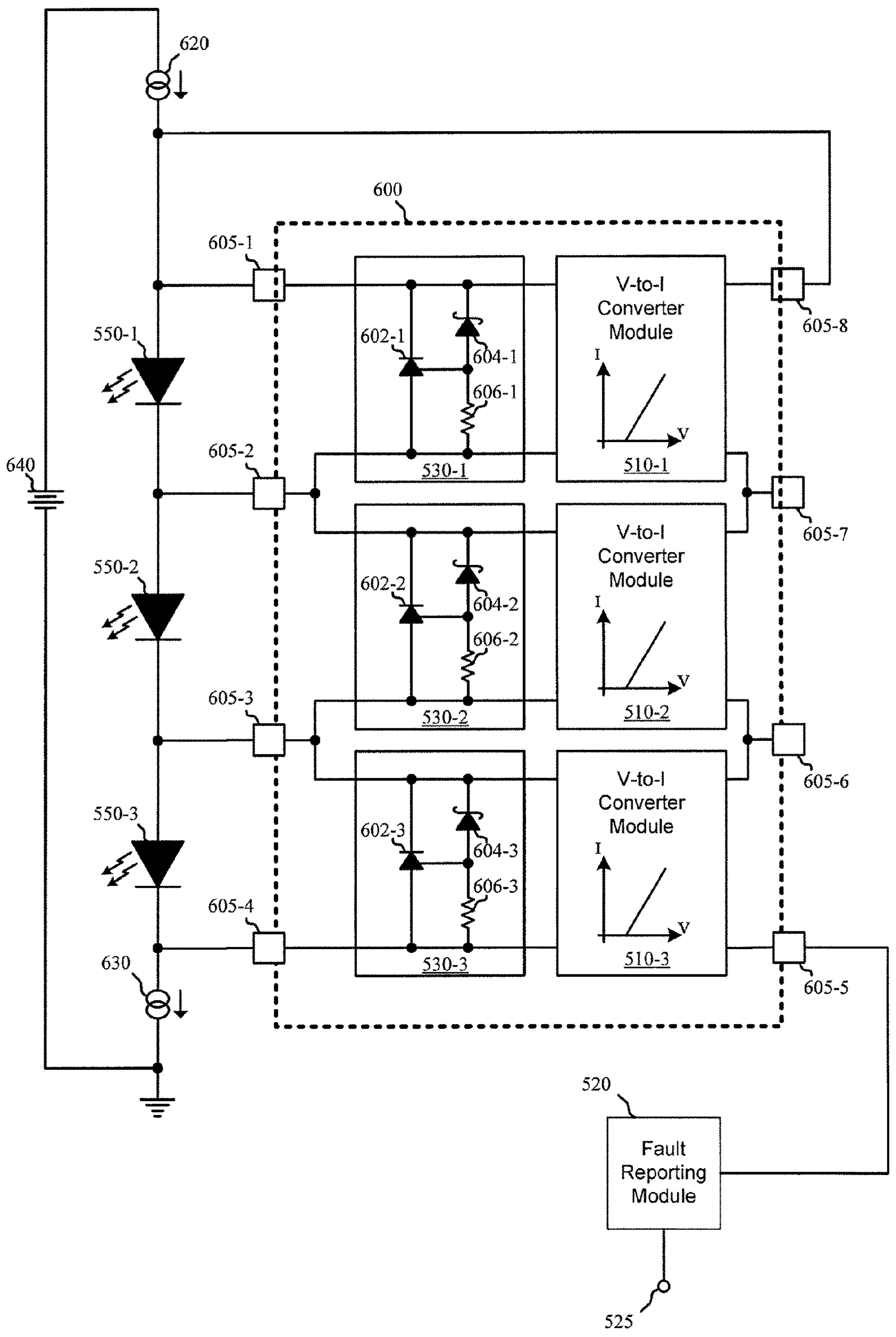
FIG. 6A shows a simplified application schematic diagram using an IC with three integrated fault control modules, according to various embodiments.

FIG. 6A shows a simplified application schematic diagram using an IC with three integrated fault control modules, according to various embodiments. The IC 600 includes three fault control modules 530 and three fault monitoring modules 510. A number of pins 605 may be provided to allow electrical coupling of one or more components (e.g., the LEDs 550) with the components of the IC 600. While many types of fault control modules 530 are possible, for example as described above, each fault control module 530 is shown as an illustrative circuit that includes an SCR 602 triggered by a zener diode 604 in series with a resistor 606.

The fault detection modules 510 are adapted to detect faults in a respective LED 550. Embodiments of the fault detection modules 510 detect closed circuit faults (e.g., where the LED 550 fails to create a short circuit or where the LED 550 fails open, causing the SCR 602 to trigger and generate an alternate closed circuit path around the failed LED 550). In some embodiments, as shown, the fault detection modules 510 are voltage-to-current converters with a threshold. The threshold may be set such that a current is output when the respective LED 550 is operating properly, and to output no current when the LED 550 fails.

According to the application schematic shown in FIG. 6A, the LEDs 550 and/or the IC 600 are driven by a power source 640. A current source 620 and/or current sink 630 may be used with the power source 640 to maintain a desired current through the LEDs 550. For example, in some laser LED applications, regulations may require providing both the current source 620 and the current sink 630 to ensure that the current through the LEDs 550 will be maintained even when one current regulation device (e.g., the current source 620 or the current sink 630) fails.

It is worth noting that many configurations and applications of the IC 600 are possible. For example, as described above, embodiments of the IC 600 are configured to be coupled with one or more other ICs 600. In this way, large strings of LEDs 550 may be used with embodiments of the IC 600 for certain applications. Further, depending on the types of LEDs 550 and/or other components used in the IC 600 or in communication with the IC 600, different manufacturing or implementation processes may be used. In one embodiment, the IC 600 is rated for use with three LEDs 550 at approximately thirty-milliamps each. As the IC 600 may only have to dissipate around one-hundred milliwatts in a worst case, standard low-voltage manufacturing processes and/or components may be used. In another embodiment, the IC 600 is rated to dissipate ten watts (e.g., where each of three LEDs 550 dissipates approximately three watts), which may necessitate manufacturing processes and/or components capable of handling the power dissipation.

In some embodiments, the outputs from one or more of the fault detection modules 510 are sent to a fault reporting module 520 to analyze the fault data. Embodiments of the fault detection module 510 are configured to be cascaded. For example, a large display application may include a series string of thousands of LEDs. Using cascading, fault reporting for the entire display may be effectuated through a cascaded topology. Notably, the fault detection modules 510 may be configured, so that even a large number of cascaded fault detection modules 510 can be manufactured using low-voltage techniques.

For example, in one embodiment, the IC 600 is connected with three LEDs 550, each having an operating voltage of around four volts (e.g., some blue or white LEDs 550). It will be appreciated that, if each fault detection module 510 is independently connected to the fault reporting module, the first fault detection module 510-1 may see a voltage of approximately twelve volts with respect to ground for the fault reporting module 520. This may require the fault detection module 510-1 to be manufactured using twelve-volt components and/or process technologies. However, when cascaded, the output of the first fault detection module 510-1 is used as the input of the second fault detection module 510-2, the output of the second fault detection module 510-2 is used as the input of the third fault detection module 510-3, and the output of the third fault detection module 510-3 is sent to the fault reporting module 510-3. In this cascaded topology, each fault detection module 510 may only see approximately four volts.

It will be appreciated that, by arranging the various components in topologies similar to those described in FIGS. 6A (e.g., and 6B, below), many types of fault detection and reporting are possible. For example, a large LED display may include thousands of LEDs, implemented as a number of LED modules, each having three LEDs. In some embodiments, faults are reported per module (e.g., a global fault is reported, indicating a fault in one of the three LEDs 550 in the module). For example, the output from each IC 600 is monitored at pin 605-5 to detect and report a global fault for that set of LEDs 550. In other embodiments, fault information is reported for the entire display. For example, a cascaded version of the topology of FIG. 6A is used. In still other embodiments, fault information is reported for individual LED modules.

Some embodiments for reporting individual LED 550 faults operate within a cascaded topology, like the one shown in FIG. 6A. Information may be sent from each fault detection module 510 to each other fault detection module 510 (e.g., in series), and the information may be ultimately communicated to the fault reporting module 520. For example, a string of bits is transmitted through the various fault detection modules 510. If 16 fault detection modules 510 are cascaded, a 16-bit signal may be used. As the string of bits reaches each fault detection module 510, a respective one of the 16 bits is toggled if there is a fault detected in the respective LED 550. For example, if the third LED 550 has a fault, the third bit may be set to a logical HIGH. In other embodiments, more complex packet structures and/or other techniques may be used to cascadably communicate fault information, including fault type, fault location, maintenance information, and/or any other useful information.

Figure 6B:
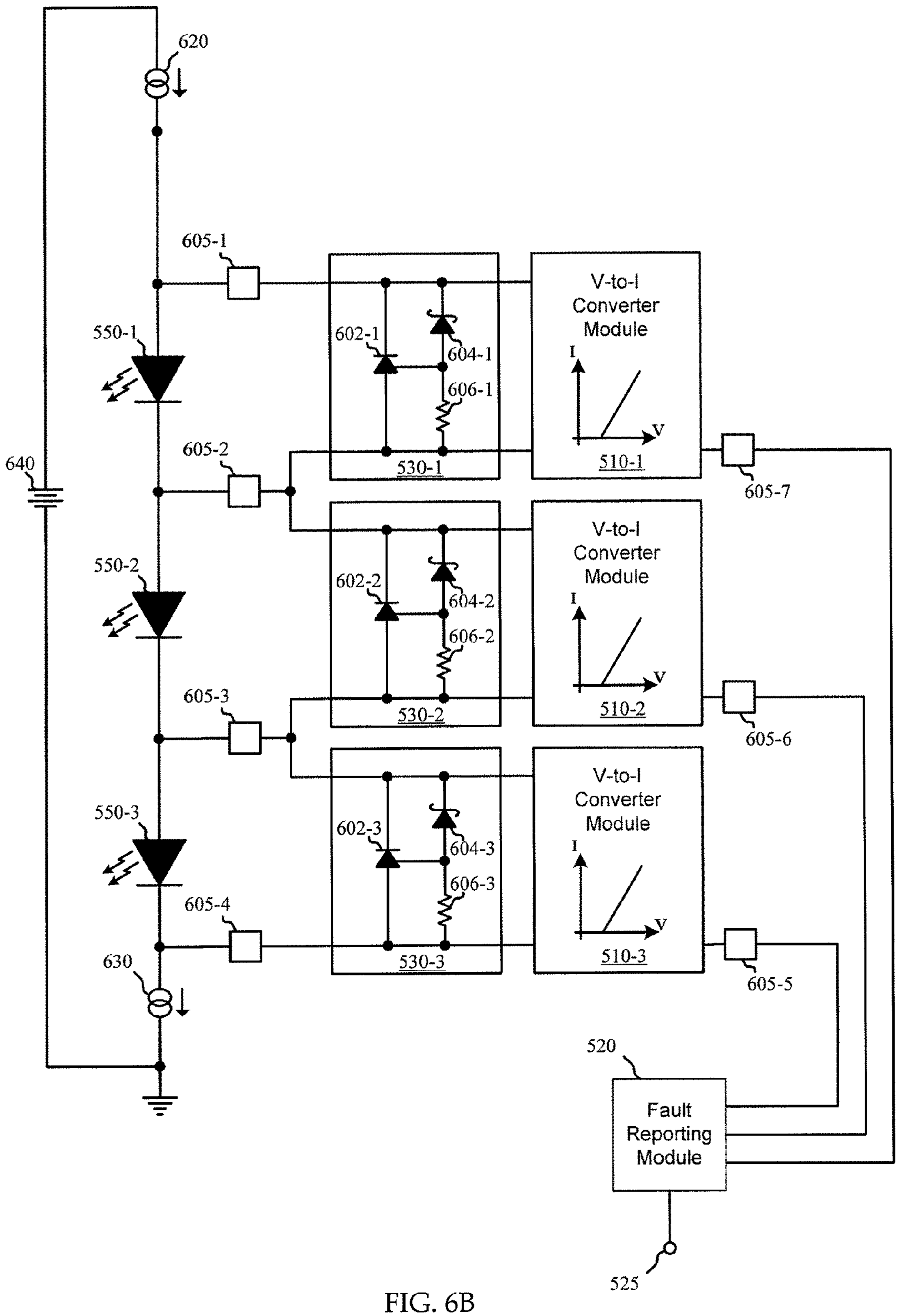
FIG. 6B shows a simplified application schematic diagram using three fault control modules arranged for use in fault detection for individual LEDs, according to various embodiments.

Other embodiments for individual LED 550 fault reporting may use topologies that are not cascaded. FIG. 6B shows a simplified application schematic diagram using three fault control modules arranged for use in fault detection for individual LEDs, according to various embodiments. For example, each LED 550 may be packaged along with a respective fault control module 530 and fault detection module 510. In some embodiments, the fault control modules 530 and/or the fault detection modules 510 are configured as described in FIG. 6A.

In some embodiments, each fault control module 530 and each fault detection module 510 is powered by the anode side of their respective LED 550. Each fault detection module 510 provides an output pin 605 for outputting fault information for the respective LED 550. As described above, the fault detection output for each fault detection module 510 may indicate whether a fault condition exists and, in some embodiments, what type of fault condition exists.

As shown in FIG. 6B, the outputs of the fault detection modules 510 are communicated to one or more fault reporting modules 520. The fault reporting module 520 may be configured to output a digital or analog fault reporting signal 525. For example, the fault reporting signal 525 may indicate number, type, location, and/or other information about faults as a function of one or more analog voltage levels, digital word, or any other useful output representation.

In one embodiment, the fault reporting module 520 receives fault reporting information from each of the fault detection modules 510 and generates a binary word. For example, an 8-LED system may be represented by an 8-bit word, where each bit is either a "1" when the corresponding LED 550 is operating properly or "0" when the corresponding LED 550 has failed. In this way, an output of "11010111" from the fault reporting module 520 may indicate that the third and fifth LEDs 550 in the string have fault conditions.

In some other embodiments, the fault detection module 510 is a light detector (e.g., a photodetector, a charge-coupled device (CCD), etc.). In certain embodiments, a light detector is used to detect the light output of each LED 550. For example, a photodetector may be used to detect the intensity, color, or other information about the light output from a respective LED 550. In certain other embodiments, a light detector is used to monitor the light output from a number of LEDs 550. For example, a CCD or other device may be used to monitor the light intensity and/or color of a large set of LEDs 550. The fault reporting module 520 may then include certain image processing functionality for decoding fault information.

Of course other types of output information are also possible, according to embodiments of the invention. In some embodiments, output information may indicate more than just whether the LED 550 has or has not failed (e.g., by representing each LED 550 condition by more than one bit, by using an analog signal, by generating certain predefined fault codes, etc.). In one embodiment, the fault reporting module 520 only reports a fault when a certain number of LEDs 550 have failed in a certain condition. For example, in an automobile having LED headlamps, it may be desirable for a dashboard indicator to indicate when more than twenty percent of the LEDs in the headlamp have failed.

In another embodiment, the fault reporting module 520 reports which LED 550 has failed, and other information about the LED 550. For example, in a large display application, each LED 550 may be carefully calibrated or selected to maintain a certain color consistency across the display. As a result, each LED 550 may be slightly different, depending on its position in the display. The fault reporting module 520 may report that a particular LED 550 has failed, along with the two-dimensional position of the failed LED 550 and/or specific calibration or selection specifications of the LED 550 needed in that position in the display. In certain embodiments, information like this may be communicated with an automated LED 550 replacement system (e.g., for automatic replacement of the faulty LED). Of course, other information may also be desired, such as failure rates, frequency of replacement, frequencies of different types of failures, statistical information, etc. These and other types of information may be generated or received by the fault reporting module 520 or by some other system.

In yet another embodiment, the fault reporting module 520 is configured to detect changes in color of an LED's 550 light output over time. For example, certain types of LEDs 550 change color as they age. As such, it may be possible to monitor the health of an LED 550 by monitoring changing color in its light output. This information may be used, for example, to predict a future fault condition in the LED 550, to schedule maintenance in advance of a total fault condition, to adjust current output to the LED 550 to at least partially correct the change in color, etc.

Global fault detection may include techniques, like voting circuits, analog gates, etc. For example, all the outputs of the fault detection modules 510 may be passed to a voting circuit or a logical OR gate, the output of which indicating whether any one or more of the LEDs is experiencing a fault condition. Individual fault detection may include techniques, like digital word generation, digital signal processing, etc. Of course, many other types of detection and reporting are possible according to various embodiments.

Figure 7A:
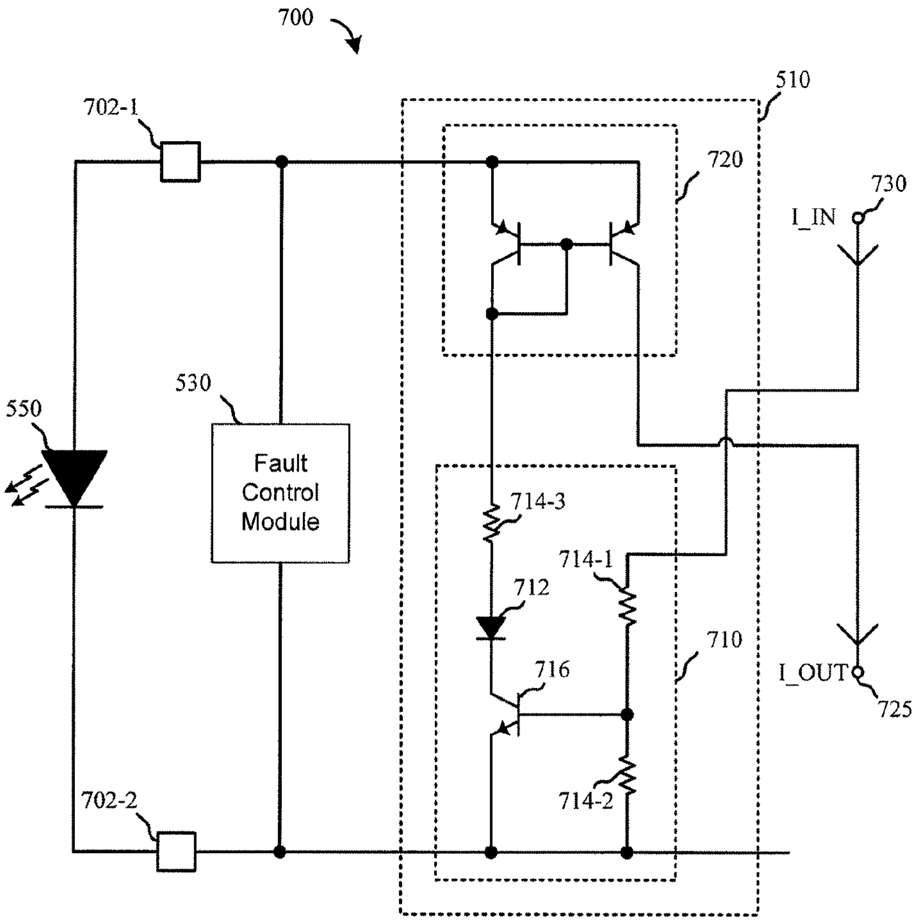
FIG. 7A shows a simplified schematic diagram of a circuit arrangement having a fault detection module, according to various embodiments

As described above, in some embodiments, the fault detection modules 510 are voltage-to-current converters with a threshold. The threshold may be set such that a current is output when the respective LED 550 is operating properly, and to output no current when the LED 550 fails. FIG. 7A shows a simplified schematic diagram of a circuit arrangement 700 having a fault detection module 510, according to various embodiments. The circuit arrangement 700 includes an LED 550, a fault control module 530, and a fault detection module 510. The fault detection module includes a voltage-to-current converter 710 and a current mirror 720.

The fault control module 530 is adapted to establish an alternate current path when its respective LED 550 fails in an open circuit condition. As such, both an open circuit failure and a closed circuit failure of the LED 550 may look relatively like a short circuit condition in relation to the operational condition for the LED 550. In one embodiment, the fault control module 530 is implemented as the circuit shown in FIG. 3.

Figure 7B:
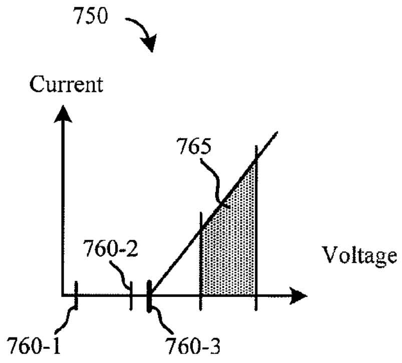
FIG. 7B shows a simplified graph of the current generated in the current mirror versus the voltage between voltage rails of FIG. 7A, according to various embodiments.

For increased clarity, the operation of the voltage-to-current converter 710 will be described with reference to illustrative information provided in FIGS. 7A and 7B in parallel. FIG. 7B shows a simplified graph of the current generated in the current mirror 720 versus the voltage between rail 702-1 and rail 702-2 (e.g., which may be pins 605 of IC 600, as shown in FIG. 6). The voltage-to-current converter 710 is adapted to detect a fault in the LED 550 by detecting a change in the voltage between rail 702-1 and rail 702-2 and converting that voltage to a current signal. The current mirror 720 may act as an isolation device by forcing the output current at node 725 to mirror the current signal generated by the voltage-to-current converter 710, regardless of output loading conditions.

Different types and colors of LEDs 550 may have different nominal operating voltages (e.g., typically around 1.4-4 volts). As such, when the LED 550 is operational, the voltage between rail 702-1 and rail 702-2 may substantially equal the nominal operating voltage of the LED 550. The voltage-to-current converter 710 may be adapted so that its diode 712 will turn ON when the voltage between rail 702-1 and rail 702-2 is higher than some threshold voltage, illustrated as threshold voltage level 760-3 in FIG. 7B.

In normal operation, an input current is present at node 730, which develops a base voltage on a transistor 716 (e.g., an NPN bipolar junction transistor), for example, due to the resistor divider network having resistors 714-1 and 714-2. When the base voltage is present, this may turn transistor 716 ON (e.g., force transistor 716 into saturation), causing current to flow through diode 712, current-limiting resistor 714-3, and the diode-connected transistor device in the current mirror 720. It is worth noting that, in normal operating mode (e.g., when a current is present at node 730), the voltage between rail 702-1 and rail 702-2 must be at least sufficient to maintain current flow through the fault detection module 510. For example, as illustrated, the normal operational current path through the fault detection module 510 includes approximately two diodes.

As such, at least two diode-drops-worth of voltage may be needed between rail 702-1 and rail 702-2 to keep the fault detection module 510 functioning. When the LED 550 is operating properly, sufficient voltage will be present between rail 702-1 and rail 702-2 to maintain current flow through the fault detection module 510. This current may then be mirrored by the current mirror 720, and output at node 725.

When the LED 550 experiences a fault condition, a substantially short-circuit condition may occur. For example, depending on the embodiment and the type of fault condition, there may be a closed-circuit fault in the LED 550, an open circuit fault in the LED that causes the fault control module 530 to be triggered to create a short circuit condition, etc. Regardless of the specific implementation of the fault control module 510 or other circuitry, embodiments of the fault detection module 510 are configured to ensure that a fault condition in the LED 550 results in the voltage between rail 702-1 and rail 702-2 dropping below a minimum voltage for maintaining current flow through the fault detection module 510.

In one embodiment, the substantially short circuit condition resulting from the LED 550 fault causes the voltage between rail 702-1 and rail 702-2 to drop somewhere below 1.4 volts. An embodiment of the fault detection module 510 requires at least 1.4 volts to maintain current flow (e.g., the two diodes will turn OFF if there is not at least two diode-drops-worth of voltage between rail 702-1 and rail 702-2. As such, when there is a fault condition in the LED 550, current will cease flowing in the fault detection module 510, and the output current at node 725 will be substantially zero.

It will be appreciated that many variations to the embodiment of FIG. 7A are possible without departing from the scope of the invention. For example, as described above, normal operation of the LED 550 may manifest a first voltage level between rail 702-1 and rail 702-2, while a fault condition in the LED 550 may manifest a second voltage level between rail 702-1 and rail 702-2. The fault detection module 510 may be configured to provide a first output at node 725 (e.g., a current or voltage) when the voltage between rail 702-1 and rail 702-2 is at or above the first voltage level, and to provide a second output at node 725 (e.g., no current or no voltage) when the voltage between rail 702-1 and rail 702-2 is below the first voltage level.

This functionality of the fault detection module is illustrated in FIG. 7B. Normal operational range for various LEDs 550 (e.g., different colors) is indicated in FIG. 7B as region 765. It will be appreciated that over the region 765 (e.g., over the operational voltage range of the LEDs 550), a current may be generated to be proportional or otherwise mathematically related to the operating voltage (e.g., the voltage between rail 702-1 and rail 702-2). This may manifest as an output current at node 725.

When the LED 550 fails, the voltage between rail 702-1 and rail 702-2 may effectively drop to a level below some threshold voltage needed to maintain current output from the fault detection module 510 (e.g., to a level significantly below the operational voltage of the LED 550). This fault condition voltage level is indicated as voltage levels 760-1 and 760-2 in FIG. 7B. For example, voltage level 760-1 may be the voltage level between rail 702-1 and rail 702-2 when the LED 550 fails in a closed-circuit condition, while voltage level 760-2 may be the voltage level between rail 702-1 and rail 702-2 when the LED 550 fails in an open circuit condition. In either condition, the voltage level drops below the level needed to maintain current flow in the fault detection module 510, which may effectively cause the output current at node 725 to go LOW.

In some embodiments, the fault detection module 510 is configured to be cascaded (e.g., in the topology shown in FIG. 6A). In a cascaded topology, the input current is received at node 730 either from a current source or from another fault detection module 510. The output current at node 725 is passed either to a fault reporting module (e.g., fault reporting module 520 of FIG. 5) or as the input current to another fault detection module 510.

For example, the fault detection module 510 of FIG. 7A may be used in the topology of FIG. 6A. For fault detection module 510-1, the input current node (e.g., node 730 of FIG. 7A) may be tied to the current source 620 via pin 605-8. The output current node (e.g., node 725 of FIG. 7A) of fault module 510-1 may be tied to the input current node (e.g., node 730) of fault detection module 510-2 and/or pin 605-7. The output current node (e.g., node 725 of FIG. 7A) of fault module 510-2 may be tied to the input current node (e.g., node 730) of fault detection module 510-3 and/or pin 605-6. The output current node (e.g., node 725 of FIG. 7A) of fault module 510-3 may be tied to a fault reporting module (e.g., fault reporting module 520 of FIG. 5) via pin 605-5. It will be appreciated that, if there is a fault condition in any of the LEDs 550, the current output at pin 605-5 may be substantially zero.

It will be appreciated that many other types of fault detection module 510 are possible according to the invention. Some fault detection modules 510 may only detect certain types of faults (e.g., only open circuit failures), others may detect different types of faults differently (e.g., by using separate detection circuit for the open circuit and closed circuit failure conditions), and still others may detect different types of faults in the same way (e.g., by forcing open circuit failures to look like closed circuit failures. It is worth noting that, in some embodiments, voltage level 760-1 and voltage level 760-2 are set to be different enough to be identifiable by the fault detection module 510. As such, the output of the fault detection module 510 (e.g., at node 725) may effectively indicate one of three (e.g., or more) states: when the LED is operational, when there is a closed circuit fault, and when there is an open circuit fault.

As discussed above, regardless of how the LED 550 fails (e.g., in an open circuit or closed circuit condition), it may be desirable to detect and report the failure. As such, after detecting the failure of an LED 550, embodiments of the fault detection module 510 send fault reporting information to a fault reporting module (e.g., fault reporting module 520 of FIG. 5) for processing and/or reporting. Embodiments of the fault reporting module 520 may report global faults (e.g., if any one or more LEDs 550 in the string of LEDs 550 fails, the fault reporting module 520 may report only globally that a fault is present somewhere in the string) or specific fault locations. Further, some embodiments of the fault reporting module 520 can report what type of fault occurred, if desired.

Figure 8:
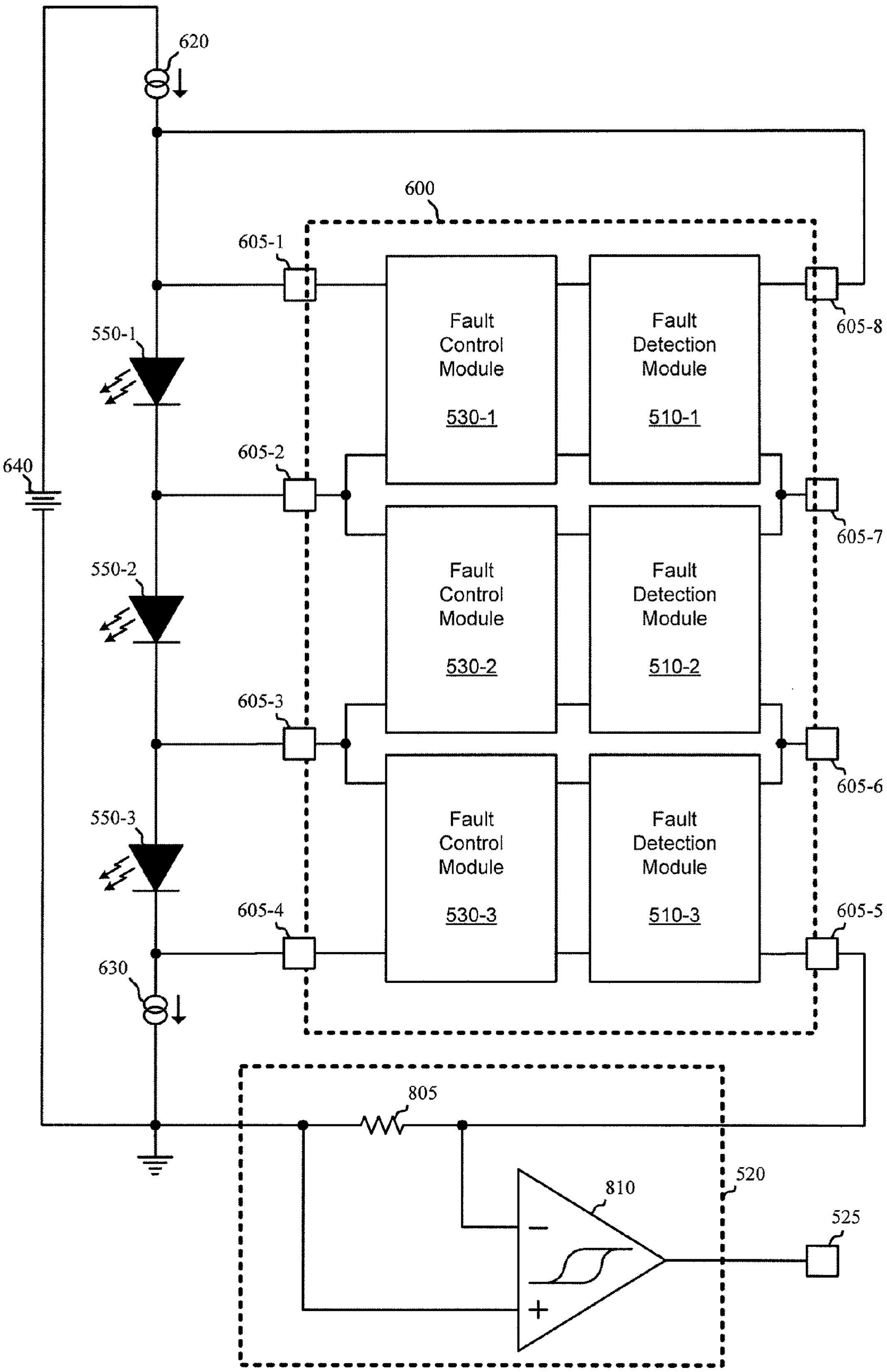
FIG. 8 shows a simplified application schematic diagram using an IC connected with a fault reporting module, according to various embodiments.

It will be appreciated that many implementations of fault monitoring are possible, according to embodiments of the invention. Further, embodiments of the invention may be implemented in different forms with different types of integration. FIG. 8 shows a simplified application schematic diagram using an IC 600 connected with a fault reporting module 520, according to various embodiments. The IC 600 is illustrated as the IC 600 of FIG. 6, including three integrated fault detection modules 510 and three integrated fault control modules 530, configured to detect and control faults for three LEDs 550. The IC 600 is driven by a power source 640, a current source 620, and/or a current sink 630. Each fault detection module 510 is configured to output a current when the respective LED 550 is operating properly and output no current when the respective LED 550 fails.

In some embodiments, one or more outputs from the fault detection modules 510 are sent to a fault reporting module 520 for processing and/or reporting. The fault reporting module 520 is shown as including a hysteresis comparator 810. When all the LEDs 550 are operating properly, current may flow into pin 605-8, through the fault detection modules 510, and out pin 605-5. This may create a voltage across a resistor 805 in the fault reporting module 520 (connected across the inputs of the hysteresis comparator 810), holding the hysteresis comparator 810 output 525 in a LOW state. If any LED 550 fails, no current will flow through the respective fault detection module 510, and no current will flow out pin 605-5. This may drive down the differential voltage seen at the inputs of the hysteresis comparator 810, in turn, driving the output 525 of the hysteresis comparator 810 to a HIGH state.

It is worth noting that many configurations and applications of the IC 600 are possible, for example as described above. For example, embodiments of the IC 600 are configured to be coupled with one or more other similar ICs 600. In this way, large strings of LEDs 550 may be used with embodiments of the IC 600 for certain applications. Further, depending on the types of LEDs 550 and/or other components used in the IC 600 or in communication with the IC 600, different manufacturing or implementation processes may be used (e.g., for different power dissipation).

Figure 9:
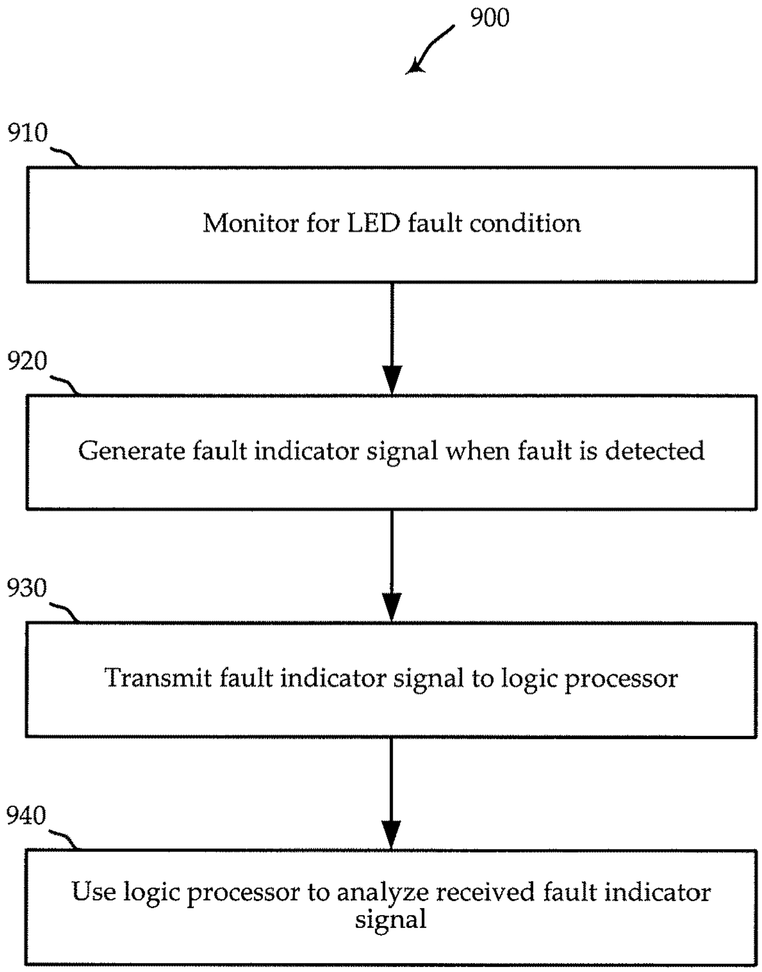
FIG. 9 shows a flow diagram of illustrative methods for fault detection and reporting in a series LED application, according to various embodiments.

FIG. 9 shows a flow diagram of illustrative methods for fault detection and reporting in a series LED application, according to various embodiments. The method 900 begins at block 910 by monitoring for an LED failure condition (e.g., using a fault detection module). In some embodiments, the fault indicator signal indicates a global fault condition in the LED string; while in other embodiments, the fault indicator signal indicates individual fault conditions in one or more LEDs in the LED string. When the LED failure condition is detected in block 910, a fault indicator signal may be generated at block 920. At block 930, the fault indicator signal is communicated to a logic processor (e.g., a fault reporting module). As described above, in various embodiments, the logic processor may process the fault indicator using analog and/or digital techniques. The fault indicator signal may then be processed and/or reported out.

It is worth noting that, once the fault condition(s) are reported, they may be used in a number of different ways. For example, maintenance may be scheduled and/or performed as a function of the fault reporting. In one embodiment, a power system dynamically adjusts voltages and/or currents to the LEDs in an application (e.g., in a display) as a function of LED faults, changes in LED color or brightness, etc. In another embodiment, maintenance is alerted and/or dispatched when one or more LEDs (e.g., or some number or percentage of LEDs) fails. In yet another embodiment, an indicator (e.g., a dashboard indicator in an automobile) is configured to indicate LED failures as a function of the fault reporting. In still another embodiment, maintenance equipment is configured to decode fault reporting information to determine fault locations, fault types, part ordering, part replacement selection, etc.

It should be noted that the methods, systems, and devices discussed above are intended merely to be examples. Various embodiments may omit, substitute, or add various procedures or components as appropriate. For instance, it should be appreciated that, in alternative embodiments, the methods may be performed in an order different from that described, and that various steps may be added, omitted, or combined. Also, features described with respect to certain embodiments may be combined in various other embodiments. Different aspects and elements of the embodiments may be combined in a similar manner. Also, it should be emphasized that technology evolves and, thus, many of the elements are examples and should not be interpreted to limit the scope of the invention.

It should also be appreciated that the following systems, methods, and software may individually or collectively be components of a larger system, wherein other procedures may take precedence over or otherwise modify their application. Also, a number of steps may be required before, after, or concurrently with the following embodiments.

Specific details are given in the description to provide a thorough understanding of the embodiments. However, it will be understood by one of ordinary skill in the art that the embodiments may be practiced without these specific details. For example, well-known circuits, processes, algorithms, structures, waveforms, and techniques have been shown without unnecessary detail in order to avoid obscuring the embodiments.

Further, it may be assumed at various points throughout the description that all components are ideal (e.g., they create no delays and are lossless) to simplify the description of the key ideas of the invention. Those of skill in the art will appreciate that non-idealities may be handled through known engineering and design skills. It will be further understood by those of skill in the art that the embodiments may be practiced with substantial equivalents or other configurations.

Also, it is noted that the embodiments may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Accordingly, the above description should not be taken as limiting the scope of the invention, as described in the following claims.

What is claimed is:

1. A fault monitoring circuit for monitoring fault conditions in light emitting diodes ("LEDs"), the circuit comprising:

a fault detection module in electrical communication with an LED module comprising a plurality of LEDs, each of the plurality of LEDs being electrically coupled with another of the plurality of LEDs to form a series string of LEDs coupled between terminals of a power source, the fault detection module comprising a plurality of detection units, each detection unit having detector monitor terminals coupled between an anode terminal and a cathode terminal of a respective one LED of the series string of LEDs and adapted to:

detect a fault condition in the respective one of the plurality of LEDs; and output a fault indication based upon detection of the fault condition; and a fault monitoring module, in electrical communication with at least one of the detection units and adapted to receive the fault indication from the at least one of the detection units when a fault condition is detected by the at least one of the detection units in the respective one of the plurality of LEDs.

2. The circuit of claim 1, wherein the fault condition is an open circuit fault condition.

3. The circuit of claim 1, wherein each detection unit is adapted to detect the fault condition in the respective one of the plurality of LEDs by:

detecting an LED voltage across the respective one of the plurality of LEDs, the LED voltage being substantially a first voltage level when the respective one of the plurality of LEDs is operating properly and the LED voltage being substantially different from the first voltage level when the respective one of the plurality of LEDs is experiencing the fault condition.

4. The circuit of claim 3, wherein each detection unit comprises:

a voltage-to-current converter configured to detect the LED voltage and to have a threshold voltage below which the voltage-to-current converter outputs substantially zero current and above which the voltage-to-current converter outputs substantially non-zero current, wherein the first voltage level is substantially above the threshold voltage, such that the voltage-to-current converter outputs substantially zero current when the respective one of the plurality of LEDs is experiencing the fault condition and the voltage-to-current converter outputs substantially non-zero current when the respective one of the plurality of LEDs is operating properly.

5. The circuit of claim 4, wherein:

each detection unit is designed such that the threshold voltage is below an operational voltage level associated with each of the plurality of LEDs, at least some of the plurality of LEDs having associated operational voltage levels that are substantially different from operational voltage levels associated with others of the plurality of LEDs.

6. The circuit of claim 3, wherein:

the LED voltage is substantially a second voltage level when the respective one of the plurality of LEDs is experiencing an open circuit fault condition;

the LED voltage is substantially a third voltage level when the respective one of the plurality of LEDs is experiencing a closed circuit fault condition; and the third voltage level is substantially different from the second voltage level and from the first voltage level.

7. The circuit of claim 3, wherein each detection unit comprises:

a light detector in optical communication with at least one of the plurality of LEDs, and adapted to:

monitor light output of the at least one of the plurality of LEDs; and detect the fault condition of the at least one of the plurality of LEDs as a function of the light output of the at least one of the plurality of LEDs.

8. The circuit of claim 7, wherein the light detector is in optical communication with the respective one of the plurality of LEDs, and is adapted to:

monitor light output of the respective one of the plurality of LEDs; and detect the fault condition of the respective one of the plurality of LEDs as a function of the light output of the respective one of the plurality of LEDs.

9. The circuit of claim 7, wherein the light detector monitors light output by:

monitoring at least one of a light intensity level or a light color.

10. The circuit of claim 1, wherein the fault monitoring module comprises:

a comparator module, configured to receive at least one fault indication from at least one detection unit and to generate a comparator output signal indicating a global fault condition in the LED module.

11. The circuit of claim 1, wherein the fault monitoring module comprises:

a digital word generator adapted to generate a digital word as a function of the fault indication, the digital word indicating at least which of the plurality of LEDs in the LED module is experiencing the fault condition.

12. The circuit of claim 1, wherein:

the fault detection module is a first fault detection module; and the circuit further comprises a second fault detection module configured to be cascadably coupled with the first fault detection module.

13. The circuit of claim 1, wherein:

each of the plurality of detection units comprises a fault detection input node and a fault detection output node; and the fault detection output node of a first of the plurality of detection units is coupled with the fault detection input node of a second of the plurality of detection units.

14. The circuit of claim 1, wherein:

the fault monitoring module is in communication with a second fault monitoring module, and comprises a fault monitoring input node adapted to receive fault data from the second fault monitoring module.

15. The circuit of claim 1, further comprising:

a housing, configured to integratedly house at least the fault detection module, and comprising a set of pins, at least some of the pins being configured to provide an electrical interface between each detection unit and the respective one of the plurality of LEDs.

* * * * *